US012624438B2

(12) United States Patent
Tanaka et al.

(10) Patent No.: US 12,624,438 B2
(45) Date of Patent: *May 12, 2026

(54) GAS BARRIER LAMINATE, PACKAGING MEMBER, PACKAGING BAG, AND TUBULAR CONTAINER

(71) Applicant: TOPPAN INC., Tokyo (JP)

(72) Inventors: Ayumi Tanaka, Tokyo (JP); Mikinori Yamada, Tokyo (JP); Takeshi Nishikawa, Tokyo (JP); Miki Fukugami, Tokyo (JP)

(73) Assignee: TOPPAN INC., Tokyo (JP)

( * ) Notice: Subject to any disclaimer, the term of this patent is extended or adjusted under 35 U.S.C. 154(b) by 413 days.

This patent is subject to a terminal disclaimer.

(21) Appl. No.: 18/114,703

(22) Filed: Feb. 27, 2023

(65) Prior Publication Data

US 2023/0220536 A1 Jul. 13, 2023

Related U.S. Application Data

(63) Continuation of application No. PCT/JP2021/023091, filed on Jun. 17, 2021.

(30) Foreign Application Priority Data

Aug. 31, 2020 (JP) ................................. 2020-145417

(51) Int. Cl.
C23C 14/08 (2006.01)
B65D 65/42 (2006.01)
(Continued)

(52) U.S. Cl.
CPC .............. C23C 14/08 (2013.01); B65D 65/42 (2013.01); C23C 14/024 (2013.01); C23C 14/58 (2013.01)

(58) Field of Classification Search
CPC ....... C23C 14/08; C23C 14/024; C23C 14/58; B65D 65/42; B65D 35/10; B65D 35/14;
(Continued)

(56) References Cited

U.S. PATENT DOCUMENTS 7,157,147 B2 1/2007 Inui et al.
2010/0035050 A1 2/2010 Okawara et al.
(Continued)

FOREIGN PATENT DOCUMENTS

CN 107405896 A 11/2017
JP 2005-335273 A 12/2005
(Continued)

OTHER PUBLICATIONS

English machine translation for JP2012-020433. (Year: 2012).*
(Continued)

*Primary Examiner* — Michael C Miggins
(74) *Attorney, Agent, or Firm* — Foley & Lardner LLP

(57) ABSTRACT

A gas barrier laminate including: a substrate layer which contains a polyolefin resin; a metal oxide-containing layer which contains a metal oxide; and an overcoat layer which contains a polyvinyl alcohol resin, the overcoat layer having a surface, the overcoat layer having a surface which has a softening temperature of 100 to 170° C., as measured by local thermal analysis.

17 Claims, 5 Drawing Sheets

(51) Int. Cl.
*C23C 14/02* (2006.01)
*C23C 14/58* (2006.01)

(58) Field of Classification Search
CPC .... B65D 75/58; B65D 65/40; B32B 2250/24;
B32B 2255/10; B32B 2255/20; B32B
2255/26; B32B 2270/00; B32B
2307/7242; B32B 2439/46; B32B 7/12;
B32B 27/08; B32B 27/32; B32B 27/40;
B32B 2255/28; B32B 27/36; C08J
2323/08; C08J 2329/04; C08J 2323/12
See application file for complete search history.

(56) References Cited

U.S. PATENT DOCUMENTS

| | | |
|---|---|---|
| 2018/0009206 A1 | 1/2018 | Murase et al. |
| 2018/0099787 A1* | 4/2018 | Yoshida ................ B32B 27/325 |
| 2019/0240956 A1 | 8/2019 | Takasugi et al. |

FOREIGN PATENT DOCUMENTS

| | | |
|---|---|---|
| JP | 2016-052732 A | 4/2016 |
| JP | 2017-222151 A | 12/2017 |

OTHER PUBLICATIONS

Office Action issued in corresponding Chinese Patent Application No. 202180050190.6 dated Feb. 28, 2025.

European Extended Search Report issued in corresponding European Patent Application No. 21860933.7 dated Jan. 8, 2024 (6 pages).

International Searching Authority, "International Search Report," issued in connection with International Patent Application No. PCT/JP2021/023091, dated Sep. 14, 2021.

International Searching Authority, "Written Opinion," issued in connection with International Patent Application No. PCT/JP2021/023091, dated Sep. 14, 2021.

Office Action issued in corresponding Chinese Patent Application No. 202180050190 dated Nov. 26, 2025.

* cited by examiner

100

4

3

2

1

GAS BARRIER LAMINATE, PACKAGING MEMBER, PACKAGING BAG, AND TUBULAR CONTAINER

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2021/023091, filed on Jun. 17, 2021, which in turn claims the benefit of JP 2020-145417, filed Aug. 31, 2020, the disclosures of all which are incorporated herein by reference in its entirety.

TECHNICAL FIELD

The present disclosure generally relates to a gas barrier laminate, a packaging member, a packaging bag, and a tubular container.

BACKGROUND ART

As a packaging material for packaging food, and the like, a gas barrier film, in which a gas barrier layer is laminated on a polyolefin film, is known (for example, PTL 1).

CITATION LIST

Patent Literature

PTL 1: JP 2005-335273 A.

SUMMARY OF THE INVENTION

Technical Problem

In the past, barrier films generally used heat-resistant base materials such as polyester film or nylon film, which were further bonded to polypropylene or polyethylene to produce bags. The recent trend toward mono-materials has led to attempts to use polyolefin-based substrates such as polypropylene and polyethylene, as shown in PTL 1.

However, if a polyolefin-based resin such as polypropylene or polyethylene is used as a substrate in the same manner as polyester film or nylon film, resistance to heat sterilization treatment (hot water treatment) such as boiling and resistance to bending may be insufficient.

The present disclosure has been made in view of the above circumstances, and the purpose of the present disclosure is to provide a gas barrier laminate capable of achieving good hot water resistance and bending resistance using a polyolefin substrate. The disclosure is also intended to provide a packaging material including the gas barrier laminate, a packaging bag, and a tubular container.

Solution to Problem

As a result of intensive studies, the inventors have found that adjusting the softening temperature of the surface of the overcoat layer to a predetermined range was an important factor in solving the above problem, and thus they completed the gas barrier laminate according to the present disclosure.

The present disclosure provides a gas barrier laminate including: a substrate layer which contains a polyolefin resin, a metal oxide-containing layer which contains a metal oxide, and an overcoat layer which contains a polyvinyl alcohol resin, the overcoat layer having a surface which has a softening temperature of 100 to 170° C., as measured by local thermal analysis.

In an embodiment, the metal oxide-containing layer may be a vacuum deposition layer, and may have a thickness of 5 to 100 nm.

In an embodiment, the overcoat layer may contain Si.

In an embodiment, the gas barrier laminate may further comprise an anchor coat layer between the substrate layer and the metal oxide-containing layer.

In an embodiment, the overcoat layer may have a thickness of 100 to 800 nm.

The present disclosure provides a packaging material comprising the gas barrier laminate and a sealant layer.

The present disclosure provides a packaging bag including the packaging material.

The present disclosure provides a tubular container including the packaging material.

Advantageous Effects of the Invention

According to the present disclosure, it is possible to provide a gas barrier laminate that can achieve good hot water resistance and bending resistance using a polyolefin substrate. The disclosure is also intended to provide a packaging material including the gas barrier laminate, a packaging bag, and a tubular container.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

<Gas Barrier Laminate>

Figure 1:
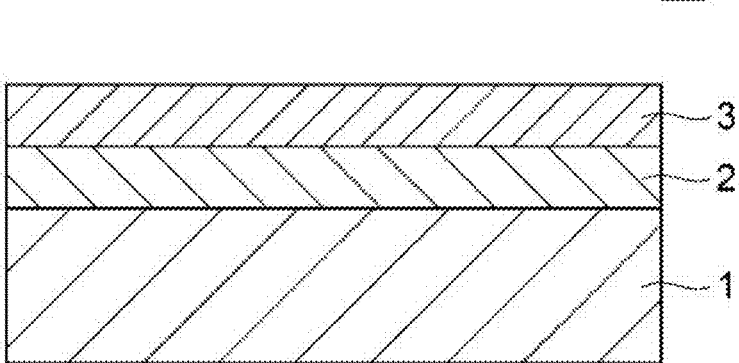
FIG. 1 is a schematic cross-sectional view illustrating a gas barrier laminate according to an embodiment.

FIG. 1 is a schematic cross-sectional view illustrating a gas barrier laminate according to an embodiment. The gas barrier laminate 10 shown in FIG. 1 includes a substrate layer 1, a metal oxide-containing layer 2, and an overcoat layer 3, which are arranged in this order.

(Substrate Layer)

The substrate layer is a film that serves as one of a support and contains a polyolefin resin.

Examples of the polyolefin resin include polyethylene (PE), polypropylene (PP), polybutene (PB), and cycloolefin polymers. Examples of the polyolefin resin include acid-modified polyolefins obtained by graft modification of a polyolefin using an unsaturated carboxylic acid, an acid anhydride of an unsaturated carboxylic acid, an ester of an unsaturated carboxylic acid, and the like. Small amounts of second-order and third-order components such as ethylene and butene may be used as raw material monomers in polypropylene synthesis. From the viewpoint of excellent heat resistance, propylene monopolymer film can be used as the substrate layer.

The polyolefin resin may be a recycled resin or a resin obtained by polymerizing biomass-derived raw materials such as plants. These resins may be used alone or mixed with resins polymerized from ordinary fossil fuels.

The film constituting the substrate layer may be a stretched film or a non-stretched film. However, in view of impact resistance, thermal stability, water resistance, dimensional stability, and the like, the film constituting the substrate layer may be a stretched film. The stretching method is not specifically limited, and the film may be stretched by any method, such as inflation, or uniaxial stretching, biaxial stretching, as long as a dimensionally stable film can be supplied.

The thickness of the substrate layer is not specifically limited. From the viewpoint of obtaining high impact resistance and high gas barrier properties, the thickness may be 9 μm to 100 μm, and preferably 15 μm to 30 μm.

The film constituting the substrate layer may have a surface to be laminated that has undergone various pretreatments, such as corona treatment, plasma treatment, flame treatment and the like, to an extent not impairing barrier properties, or may be provided with a coating layer, such as an adhesion-enhancing layer.

The film which forms the substrate layer may contain additives such as antistatic agents, UV absorbers, plasticizers, and lubricants as needed.

(Metal Oxide-Containing Layer)

A metal oxide-containing layer is a layer which imparts gas barrier properties to the substrate layer. By using a layer containing metal oxide, high gas barrier properties can be obtained while reducing the thickness. Since the metal oxide-containing layer can be formed on the substrate by vacuum deposition, it can also be called a vacuum deposition layer.

Examples of the metal oxides include silicon oxide (SiOx), aluminum oxide (AlOx), etc. specifically from the viewpoint of transparency and barrier properties. From the point of view of excellent tensile stretchability during processing, the constituent material of the metal oxide can be silicon oxide.

The metal oxide-containing layer may have a thickness of 5 to 100 nm. When the layer thickness is 5 nm or more, it is easier to obtain sufficient gas barrier properties. When the layer thickness is 100 nm or less, cracking due to deformation caused by internal stress in the thin film is suppressed, and it is easier to suppress the degradation of gas barrier properties. When the layer thickness exceeds 100 nm, the cost tends to increase due to the increase in the amount of material used and an increase in the time for forming films, which is not preferable from an economic aspect. In view of the above, the thickness of the layer containing the metal oxide may be 5 to 80 nm, 10 to 50 nm, or 20 to 40 nm.

(Overcoat Layer)

As the polyvinyl alcohol resin, any resin having a vinyl alcohol unit in which a vinyl ester unit is saponified may be used, and examples include polyvinyl alcohol (PVA) and ethylene-vinyl alcohol copolymer (EVOH). PVA can be used suitably from the viewpoint of stability and flexibility of the coating solution.

Examples of PVA include resins obtained by polymerizing a vinyl ester alone, such as vinyl acetate, vinyl formate, vinyl propionate, vinyl valerate, vinyl caprate, vinyl laurate, vinyl stearate, vinyl pivalate, or vinyl versatate, and then saponifying the polymerized product.

The PVA may also be a modified PVA obtained by copolymerization modification or post-modification. The copolymerized modified PVA may be obtained by, for example, copolymerizing a vinyl ester and an unsaturated monomer copolymerizable with the vinyl ester, and then saponifying the polymerized product. The post-modified PVA may be obtained by copolymerizing a PVA which has been obtained by saponifying a vinyl ester with an unsaturated monomer in the presence of a polymerization catalyst. The degree of modification of the modified PVA can be less than 50 mol % from the viewpoint of obtaining sufficient gas barrier properties, and may be 10 mol % or more from the viewpoint of obtaining the effect of modification.

Examples of the above unsaturated monomer include: olefins such as ethylene, propylene, isobutylene, α-octene, α-dodecene, and α-octadecene; hydroxy group-containing α-olefins such as 3-buten-1-ol, 4-pentyn-1-ol, and 5-hexen-1-ol; unsaturated acids such as acrylic acid, methacrylic acid, crotonic acid, maleic acid, maleic anhydride, itaconic acid, and undecylenic acid; nitriles such as acrylonitrile and methacrylonitrile; amides such as diacetone acrylamide, acrylamide, and methacrylamide; olefin sulfonic acids such as ethylene sulfonic acid, allyl sulfonic acid, and methallyl sulfonic acid; vinyl compounds such as alkyl vinyl ether, dimethyl allyl vinyl ketone, N-vinylpyrrolidone, vinyl chloride, vinyl ethylene carbonate, 2,2-dialkyl-4-vinyl-1,3-dioxolane, glycerin monoallyl ether, and 3,4-diacetoxy-1-butene; vinylidene chloride, 1,4-diacetoxy-2-butene, vinylene carbonate, polyoxypropylene, and polyoxypropylene vinyl amine. From the viewpoint of gas barrier properties, the unsaturated monomer may be an olefin, and most preferably be ethylene.

Examples of the polymerization catalyst include radical polymerization catalysts such as azobisisobutyronitrile, benzoyl peroxide, and lauryl peroxide. The polymerization method is not specifically limited, and bulk polymerization, emulsion polymerization, solvent polymerization, and the like can be used.

The degree of polymerization of PVA is preferably 300 to 3000. When the degree of polymerization is 300 or more, it is easy to achieve good barrier properties, and when the degree of polymerization is 3000 or less, it is easy to control the lowering of the coating suitability due to excessively high viscosity. The degree of saponification of PVA is preferably 80 mol % or more, more preferably 90 mol % or more, and still more preferably 98 mol % or more. Further, the degree of saponification of PVA may be 100 mol % or less, or may also be 99.9 mol % or less. The degree of polymerization and degree of saponification of PVA can be determined according to the method described in JIS K 6726 (1994).

Saponification can be carried out with an alkali or acid. From the viewpoint of saponification rate, an alkali can be used. Examples of the alkali include alkali metal hydroxides such as sodium hydroxide and potassium hydroxide, and alkali metal alkoxides such as sodium ethylate, potassium ethylate and lithium methylate.

An overcoat layer may contain Si (Si element). Specifically, the overcoat layer may be a cured product of a raw material for forming an overcoat layer containing a polyvinyl alcohol resin and a silane compound. Examples of silane compounds include tetraalkoxysilanes such as tetramethoxysilane and tetraethoxysilane, and silazanes such as hexamethyldisilazane. As the silane compound, a compound commonly used as a silane coupling agent or a polysiloxane compound having a siloxane bond may be used. By using a silane coupling agent, the strength in the overcoat layer is further improved, and barrier properties and water resistance are likely to be improved. Examples of the silane coupling agent include epoxysilane (glycidoxypropyltrimethoxysilane, glycidoxypropyltriethoxysilane, etc.), (meth) acrylsilane (acryloxypropyltrimethoxysilane, etc.), aminosilane, ureidosilane, isocyanate silane, isocyanurate silane (tris(3-trialkoxysilylpropyl) isocyanurate, etc.), and mercaptosilane.

When forming the overcoat layer, the amount of silane compound in the raw material for forming an overcoat layer may be 0 to 0.75 parts by mass, may be 0.05 to 0.5 parts by mass, or may be 0.1 to 0.4 parts by mass relative to 1 part by mass of the polyvinyl alcohol resin, from the viewpoint of adhesion with the metal oxide-containing layer and maintenance of gas barrier properties.

The overcoat layer may contain a polyurethane resin in terms of bending resistance and gas barrier properties. Specifically, the overcoat layer may be a cured product of a raw material for forming an overcoat layer containing a polyvinyl alcohol resin, a polyurethane resin, and a silane compound. The polyurethane resin is preferably an aqueous polyurethane resin.

The aqueous polyurethane resin contains an acid group-containing polyurethane resin, and a polyamine compound. In other words, a polyurethane resin is a reaction product of an acid group-containing polyurethane and a polyamine compound, or a product obtained by cross-linking an acid group-containing polyurethane with a polyamine compound. The use of an aqueous polyurethane resin makes it possible to easily provide flexibility, gas barrier properties, and especially oxygen barrier properties to the overcoat layer. In the aqueous polyurethane resin, the gas barrier properties are developed by combining the acid group of the acid group-containing polyurethane resin with a polyamine compound as a crosslinking agent. The bond between an acid group of the acid group-containing polyurethane resin and a polyamine compound may be an ionic bond (for example, an ionic bond between a carboxyl group and a tertiary amino group), or may be a covalent bond (for example, an amide bond or the like).

The acid group-containing polyurethane resin constituting the aqueous polyurethane resin is anionic and self emulsifying since it has an acid group, and thus it is also called an anionic self emulsifying polyurethane resin. The acid group of the acid group-containing polyurethane resin can be combined with the amino group (primary, secondary, tertiary amino group) of the polyamine compound that constitutes the aqueous polyurethane resin. The acid group may be a carboxyl group, sulfonic acid group, or the like. The acid group can usually be neutralized using a neutralizer (base) and may form a salt and a base. The acid group may be located at a terminal or a side chain of the acid group-containing polyurethane resin, and is preferably located at least at a side chain.

The acid value of the acid group-containing polyurethane resin can be selected to be in the range where the acid group-containing polyurethane resin becomes water dispersible, and is generally in the range of 5 to 100 mg KOH/g, and more preferably in the range of 10 to 70 mg KOH/g, and even more preferably in the range of 15 to 60 mg KOH/g. When the acid value of the acid group-containing polyurethane resin is less than the lower limit of the above range, the water-dispersibility of the acid group-containing polyurethane resin becomes insufficient, which may result in a decrease in the uniform dispersion of the aqueous polyurethane resin with other materials and a decrease in the dispersion stability of the coating agent. When the acid value of the acid group-containing polyurethane resin exceeds the upper limit of the above range, the water resistance and gas barrier properties of the overcoat layer may deteriorate. By keeping the acid value of the acid group-containing polyurethane resin within the above range, it is easier to avoid a decrease in dispersion stability and a decrease in water resistance and gas barrier properties. The acid value of the acid group-containing polyurethane resin is measured by a method according to JIS K 0070.

The number-average molecular weight of the acid group-containing polyurethane resin may be appropriately selected and is preferably in the range of 800 to 1,000,000, more preferably in the range of 800 to 200,000 and even more preferably in the range of 800 to 100,000. When the number-average molecular weight of the acid group-containing polyurethane resin exceeds the upper limit of the above range, the viscosity of the coating agent increases, which is not desirable. When the number-average molecular weight of the acid group-containing polyurethane resin is less than the lower limit of the above range, the gas barrier properties of the overcoat layer may be insufficient. The number average molecular weight of the acid group-containing polyurethane resin is a value measured by gel permeation chromatography (GPC) relative to a polystyrene standard.

The acid group-containing polyurethane resin may be crystalline for the purpose of improving the gas barrier properties. The glass transition temperature of the acid group-containing polyurethane resin may preferably be 100° C. or higher, more preferably be 110° C. or higher, and even more preferably 120° C. or higher. If the glass transition temperature of the acid group-containing polyurethane resin is less than 100° C., the gas barrier properties of the overcoat layer may be insufficient. The glass transition temperature of acid group-containing polyurethane resins is generally around 200° C. or lower, even 180° C. or lower, and even 150° C. or lower. It is substantially less likely that the glass transition temperature of an acid group-containing polyurethane resin that satisfies the preferred range of each of the above items will be higher than the above upper limits. A glass transition temperature of the acid group-containing polyurethane resin is preferably in a range of 100 to 200° C., more preferably 110 to 180° C., and still more preferably 120 to 150° C. The glass transition temperature of the acid group-containing polyurethane resin is measured by differential scanning calorimetry (DSC).

Polyamine compounds that constitute aqueous polyurethane resins are compounds having two or more basic nitrogen atoms. A basic nitrogen atom is a nitrogen atom that can be bonded to an acid group of an acid-containing polyurethane resin, for example, a nitrogen atom in an amino group such as a primary amino group, a secondary amino group, and a tertiary amino group. The polyamine compound is not specifically limited, and various compounds having two or more basic nitrogen atoms can be used as long as they can bind to the acid group of acid group-containing polyurethane resin and improve the gas barrier properties. As the polyamine compound, a polyamine compound having two or more amino groups of at least one kind selected from the group consisting of primary amino group, secondary amino group, and tertiary amino group is preferred.

Specific examples of the polyamine compound include alkylene diamines, polyalkylene polyamines, silicon compounds having a plurality of basic nitrogen atoms, and the like. Examples of the alkylene diamines include alkylene diamines having a carbon number of 2 to 10, such as ethylene diamine, 1,2-propylene diamine, 1,3-propylene diamine, 1,4-butane diamine, and 1,6-hexamethylene diamine. Examples of the polyalkylene polyamines include tetraalkylene polyamines. Examples of the silicon compounds having a plurality of basic nitrogen atoms (including nitrogen atoms of amino groups and the like) include silane coupling agents having a plurality of basic nitrogen atoms, such as 2-[N-(2-aminoethyl)amino]ethyl trimethoxysilane, and 3-[N-(2-aminoethyl)amino]propyl triethoxysilane.

In the aqueous polyurethane resin, the amount of the polyamine compound used preferably has a molar ratio between the acid group of the acid group-containing polyurethane resin and the basic nitrogen atom of the polyamine compound (acid group/basic nitrogen atom) in a range of 10/1 to 0.1/1, and more preferably 5/1 to 0.2/1. When the acid group/basic nitrogen atom is in the above range, cross-linking reaction between the acid group of the acid group-containing polyurethane and the polyamine compound occurs appropriately, and excellent oxygen barrier properties are exhibited in the overcoat layer.

Aqueous polyurethane resins are usually used in a dispersed state (in the form of an aqueous dispersion) in an aqueous medium. The aqueous medium includes water, water-soluble or hydrophilic organic solvents or mixtures thereof. Examples of the water-soluble or hydrophilic organic solvents include alcohols such as methanol, ethanol, and isopropanol; ketones such as acetone and methyl ethyl ketone; ethers such as tetrahydrofuran; cellosolves; carbitols; and nitriles such as acetonitrile. As the aqueous medium, water or a medium containing water as a main component is preferable. The content of water in the aqueous medium is preferably 70% by mass or more, and more preferably 80% by mass or more. The aqueous medium may or may not contain a neutralizing agent (base) that neutralizes the acid groups of the acid group-containing polyurethane resin. The aqueous medium usually contains a neutralizer.

In the aqueous dispersion of an aqueous polyurethane resin, the average particle size of dispersed particles (polyurethane resin particles) is not particularly limited, and is preferably in the range of 20 nm to 500 nm, more preferably in the range of 25 nm to 300 nm, and even more preferably in the range of 30 nm to 200 nm. If the average particle size of the dispersed particles exceeds the upper limit of the above range, uniform dispersion of the dispersed particles with other materials and the dispersion stability of the coating agent may decrease, and the gas barrier properties of the overcoat layer formed from the coating agent may become insufficient. If the average particle size of the dispersed particles is less than the lower limit of the above range, it is not expected to be effective enough to further improve the dispersion stability of the coating agent or the gas barrier properties of the overcoat layer formed from the coating agent. It is also substantially difficult to obtain such a dispersion. The average particle size is a value measured by a concentrated system particle size analyzer (FPAR-10 manufactured by Otsuka Electronics Co., Ltd.) when the solid content concentration is in a range of 0.03 to 0.3 mass % (diluted with water).

The aqueous polyurethane resin may be commercially available or manufactured by a known manufacturing method. Commercially available products include Takelac WPB-341 (manufactured by Mitsui Chemicals, Inc.) and Hydran HW350 (manufactured by DIC Corporation). Methods for manufacturing the aqueous polyurethane resin are not specifically limited, and may be ordinary aqueous conversion techniques of polyurethane resin such as an acetone method, a prepolymer method and the like. In an urethanization reaction, urethanization catalysts such as amine-based catalysts, tin-based catalysts, and lead-based catalysts may be used as necessary. For example, the acid group-containing polyurethane resin can be prepared by reacting a polyisocyanate compound, a polyhydroxy acid, and at least one of a polyol component and a chain extender component in an inert organic solvent such as ketones such as acetone, ethers such as tetrahydrofuran, or nitriles such as acetonitrile. More particularly, a polyisocyanate compound, a polyhydroxy acid, and a polyol component are reacted in an inert organic solvent (particularly, a hydrophilic or water-soluble organic solvent) to form a prepolymer having an isocyanate group at terminals thereof, followed by neutralization with a neutralizer and dissolution or dispersion in an aqueous medium. Thereafter, a chain extension component is added for reaction, from which the organic solvent is removed to prepare an aqueous dispersion of the acid group-containing polyurethane resin. An aqueous polyurethane resin in the form of an aqueous dispersion can be prepared by adding a polyamine compound to the aqueous dispersion of the acid group-containing polyurethane resin thus obtained and heating it as needed. When heating, the heating temperature is preferably 30 to 60° C.

When forming the overcoat layer, the amount of the polyurethane resin in the raw material for forming an overcoat layer may be 0.9 to 4.0 parts by mass relative to 1 part by mass of the polyvinyl alcohol resin, and may be 1.1 to 3.0 parts by mass or 1.2 to 2.5 parts by mass from the viewpoint of bending resistance and gas barrier properties.

Although the thickness of the overcoat layer is not particularly limited, it may be 50 to 1000 nm, may be 100 to 800 nm, may be 100 to 600 nm, or may be 200 to 500 nm, from the viewpoint of barrier properties and bending resistance.

The overcoat layer has a surface (a surface of the overcoat layer which faces away from the metal oxide-containing layer) which has a softening temperature of 100 to 170° C., as measured by local thermal analysis. As a result, even when a polyolefin substrate is used, it is possible to achieve both good hot water resistance and bending resistance. The inventors presume this to be due to the following reasons. That is, the softening temperature of 100° C. or higher provides sufficient heat resistance, which prevents softening during heat sterilization treatments such as boiling, thereby maintaining interlayer adhesion and gas barrier properties. Also, the softening temperature of 170° C. or lower prevents the overcoat layer from becoming too hard, which can alleviate stress with other layers when laminating, and can suppress deterioration of barrier properties due to breakage of the layer. Thus, good hot water resistance and bending resistance can be achieved. From this perspective, the softening temperature may be 110° C. or higher, may be 120° C. or higher, may be 130° C. or higher, or 160° C. or lower, and may be 150° C. or lower, or 140° C. or lower The softening temperature of the overcoat layer surface can be adjusted by the type and amount of polyvinyl alcohol resin, the type and amount of silane compound (TEOS or silane coupling agent), and the type and amount of urethane resin. For example, the softening temperature can be increased by selecting a material having a high melting point. Among the formulations of the urethane/PVA/silane coupling agent in the examples described below, the softening temperature can be increased by decreasing the amount of PVA or increasing the amount of silane coupling agent.

The softening temperature is the temperature obtained by measuring the softening behavior of a sample by local thermal analysis (LTA). The softening temperature of the overcoat layer is measured by evaluating the softening point using an atomic force microscope (AFM) equipped with a nano-thermal microscope composed of a cantilever having a heating mechanism. The cantilever is brought into contact with the specimen surface in a solid state fixed to the specimen stand, a constant force (contact pressure) is applied to the cantilever in contact mode, and a voltage is applied to the cantilever, the tip of the cantilever generates heat, which heats the specimen, causing the specimen surface to expand thermally, thereby causing the cantilever to rise. Furthermore, when the cantilever is heated, the specimen surface softens and the hardness changes significantly, causing the cantilever to descend and enter (penetrate) the specimen. The rapid displacement at this time is detected. From these behaviors, the softening temperature of the local specimen in the nanoscale region can be determined. Although it depends on the resin type to be measured, it is generally possible to set the starting temperature of the measurement to a room temperature of approximately 25° C., and set the ending temperature of the measurement to approximately 400° C. The temperature range for calculating the softening temperature may preferably be 25 to 300° C.

The contact pressure of the cantilever is required to be a force that contacts the specimen but does not destroy the surface of the specimen. In this regard, the contact pressure can be 0.1 to 3.0 V.

The heating rate of the cantilever depends on the heating mechanism provided in the cantilever, but it can generally be 0.1 to 10 V/sec and may be 0.2 to 5 V/sec. The heating rate may preferably be constant.

The amount of penetration of the cantilever is required to be deep enough to recognize the peak top of the softening curve, but too much penetration may cause the cantilever to break. From this point of view, the amount of penetration may be 3 to 500 nm, and may be 5 to 300 nm.

Although not particularly limited to these methods, the softening temperature may be determined by approximating the curve of expansion and the curve of softening, respectively, using an appropriate function and calculating the intersections of these curves.

(Anchor Coat Layer)

The gas barrier laminate may include an anchor coat layer (adhesive layer) on the substrate layer to improve adhesion to the metal oxide-containing layer and to exhibit better barrier properties. Examples of the material of the anchor coat layer include polyester resin, polyamide resin, acrylic urethane resin, polyester polyurethane resin, polyether polyurethane resin, epoxy resin, phenolic resin, (meth) acrylic resin, polyvinyl acetate resin, ethylene-vinyl alcohol copolymer, polyolefin resin such as polyethylene and polypropylene, and cellulose resin. The anchor coat layer may contain Si derived from a silane coupling agent. Specifically, the anchor coat layer may be a cured product of the above resin and a raw material containing a silane coupling agent. Among these coating agents, acrylic urethane resin and polyester polyurethane resin are preferred from the aspect of heat resistance and interlayer adhesion strength.

The anchor coat layer may have a thickness in the range of 0.01 to 2 μm, and may be 0.05 to 0.5 μm, in terms of layer uniformity and flexibility.

<Method of Producing Gas Barrier Laminate>

The gas barrier laminate can be produced by a production method that includes, for example, a step of forming a metal oxide-containing layer on a substrate layer and a step of forming an overcoat layer on a metal oxide-containing layer.

(Step of Forming a Metal Oxide-Containing Layer)

The metal oxide-containing layer can be formed by, for example, a vacuum deposition method. The vacuum deposition method can be performed as physical vapor deposition or chemical vapor deposition. Examples of the physical vapor deposition method include a vacuum vapor deposition method, a sputtering method, and an ion plating method. Examples of the chemical vapor deposition method include a thermal CVD method, a plasma CVD method, an optical CVD method, and the like. However, the step of forming a metal oxide-containing layer is not limited to these.

(Steps of Forming Overcoat Layer)

In this step, a coating solution containing a polyvinyl alcohol resin and a liquid medium can be used. The coating solution can be obtained by, for example, dissolving a synthetic polyvinyl alcohol resin powder in a liquid medium. Examples of the liquid medium include water, dimethylsulfoxide, dimethylformamide, dimethylacetamide, N-methylpyrrolidone, various glycols, alcohols such as isopropanol, polyvalent alcohols such as trimethylolpropane, and amines such as ethylenediamine and diethylenetriamine.

These may be used singly or in combination of two or more. From the viewpoint of reducing environmental burden and the like, water can be used as a liquid medium. In this case, a coating solution can be obtained by dissolving a polyvinyl alcohol resin powder in water at a high temperature (for example, 80° C.).

The content of solids containing polyvinyl alcohol resin in the coating solution can be 3 to 20% by mass from the viewpoint of maintaining good coating properties.

The coating solution may contain the above silane compound, polyurethane resin, and other components. The content of silane compounds in the coating solution may be adjusted so that the desired amount of silane compounds is included in the amount of the polyvinyl alcohol resin.

The coating solution may contain an additive such as an isocyanate or polyethyleneimine for improving adhesion. The coating solution may further contain additives such as a preservative, a plasticizer, and a surfactant.

The coating solution can be applied to the metal oxide-containing layer by any suitable method. For example, the coating solution can be applied by a wet film formation method using a gravure coater, a dip coater, a reverse coater, a wire bar coater, a die coater, or the like. The coating temperature and the drying temperature of the coating solution are not specifically limited, and may be, for example, 50° C. or higher.

The overcoat layer may be formed on the metal oxide-containing layer by an extrusion method. In the case of extrusion, a multilayer extrusion using a T-die can be used. Examples of the adhesive that can be used during extrusion include maleic anhydride modified polypropylene resin.

The adhesive layer may be formed in advance on the metal oxide-containing layer by applying the above adhesive onto the metal oxide-containing layer and then drying it.

The adhesive layer may have a thickness in the range of 0.1 to 50 μm, or 0.5 to 20 μm, in terms of adhesion, followability, and processability.

(Steps of Forming Anchor Coat Layer)

In the case of forming an anchor coat layer, this step may be performed prior to the step of forming a metal oxide-containing layer. The anchor coat layer may be formed on the substrate layer by coating or extrusion method using the material of the anchor coat layer in the same manner as the overcoat layer.

<Packaging Material>

A packaging material comprising the gas barrier laminate and a sealant layer. The sealant layer includes a layer containing a polyolefin resin or a polyester resin. The thickness of the sealant layer may be appropriately determined depending on the purpose, and may be, for example, 15 to 200 μm.

The gas barrier laminate and the sealant layer may be laminated via an adhesive layer. Examples of the adhesive constituting the adhesive layer include a polyurethane resin in which a bifunctional or higher isocyanate compound is applied to a main agent such as polyester polyol, polyether polyol, acrylic polyol, or carbonate polyol. Each type of polyol may be used alone or in combination of two or more. Further, for the purpose of promoting adhesion, a carbodiimide compound, an oxazoline compound, an epoxy compound, a phosphorus compound, a silane coupling agent, or the like may be added to the polyurethane resin mentioned above. The amount of application of the adhesive layer may be, for example, 0.5 to 10 g/m² from the viewpoint of obtaining desired adhesive strength, followability, workability, and processability. The adhesive layer may be composed of a polymer component derived from biomass or that is biodegradable, from an environmental perspective. An adhesive having barrier properties may be used for the adhesive layer.

Figure 2:
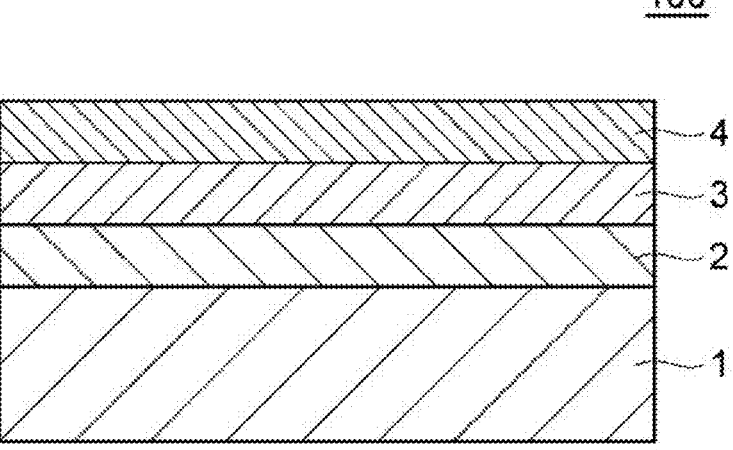
FIG. 2 is a schematic cross-sectional view of a packaging material according to an embodiment.
Figure 3:
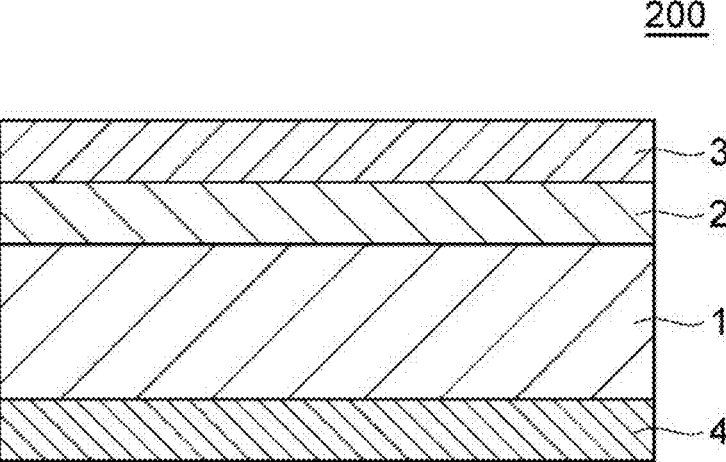
FIG. 3 is a schematic cross-sectional view of a packaging material according to an embodiment.

FIGS. 2 and 3 are schematic cross-sectional views of the packaging material according to an embodiment.

The packaging material 100 shown in FIG. 2 includes the gas barrier laminate 10, and a sealant layer 4 disposed on an overcoat layer 3 of the gas barrier laminate 10. For example, when both the substrate layer 1 and the sealant layer 4 are polyolefin resins, the content of the polyolefin resin can be 90% by mass or more (preferably 95% by mass or more) based on the total mass of the packaging material 100. Such packaging material 100 can realize mono-materials.

In the above embodiment, the packaging member 100 in which the sealant layer 4 is attached to the surface of the overcoat layer 3 of the gas barrier laminate 10 is exemplified. However, the packaging member 200 in which the sealant layer 4 is attached to the surface of the substrate layer 1 of the gas barrier laminate 10 may be used (see FIG. 3). Alternatively, the packaging member may have a sealant layer 4 laminated on the surface of the overcoat layer 3 and also on the surface of the substrate layer 1 of the gas barrier laminate 10, as described below.

The packaging member may have another substrate layer in addition to the gas barrier laminate 10 and sealant layer 4. The other substrate layers may contain a polyolefin resin, similar to the substrate layer in the gas barrier laminate 10. Another substrate layer may be a film having heat resistance, a film having easy tearing properties such as uniaxial stretching, a film having piercing resistance with a nylon layer by co-extrusion, depending on the purpose. The packaging member may have a sealant layer 4 attached to one side of the gas barrier laminate 10, and another substrate layer is attached to the other side. The packaging member may have a surface of the overcoat layer 3 of the gas barrier laminate 10 attached to one surface of another substrate layer, and the sealant layer 4 is attached to the other surface.

<Packaging Bag>

The packaging bag of the present embodiment includes the above packaging material. The packaging bag of the present embodiment can be obtained by forming the packaging member into a bag shape.

The packaging bag may be formed into the shape of a bag by folding one sheet of packaging member in two so that the sealant layers face each other and then heat-sealing on three sides of the folded sheet, or by stacking two sheets of packaging member so that the sealant layers face each other and then heat-sealing on four sides of the sheets. The packaging bag can contain contents such as food or medicine. In addition, the packaging bag may be shaped with a bent portion (folded portion) such as a standing pouch. The packaging bag of the present embodiment can maintain a high gas barrier property even when there is a bent portion.

Another form of packaging bag is a spout-equipped packaging bag. Examples of the structure of a spout-equipped packaging bag include a closure fixed between two packaging members which form the packaging bag, or a hole on one surface of the packaging bag and a spout adhered thereto. The spout can be arranged at the top of the packaging bag, diagonally on a top corner of the packaging bag, or on the side or bottom of the packaging bag. If the contents are liquid or gelatinous food, a straw that reaches the bottom of the container may be provided in addition to the spout plug (so-called spout) so that the contents can be sucked out by directly putting the spout plug in mouth.

Figure 4:
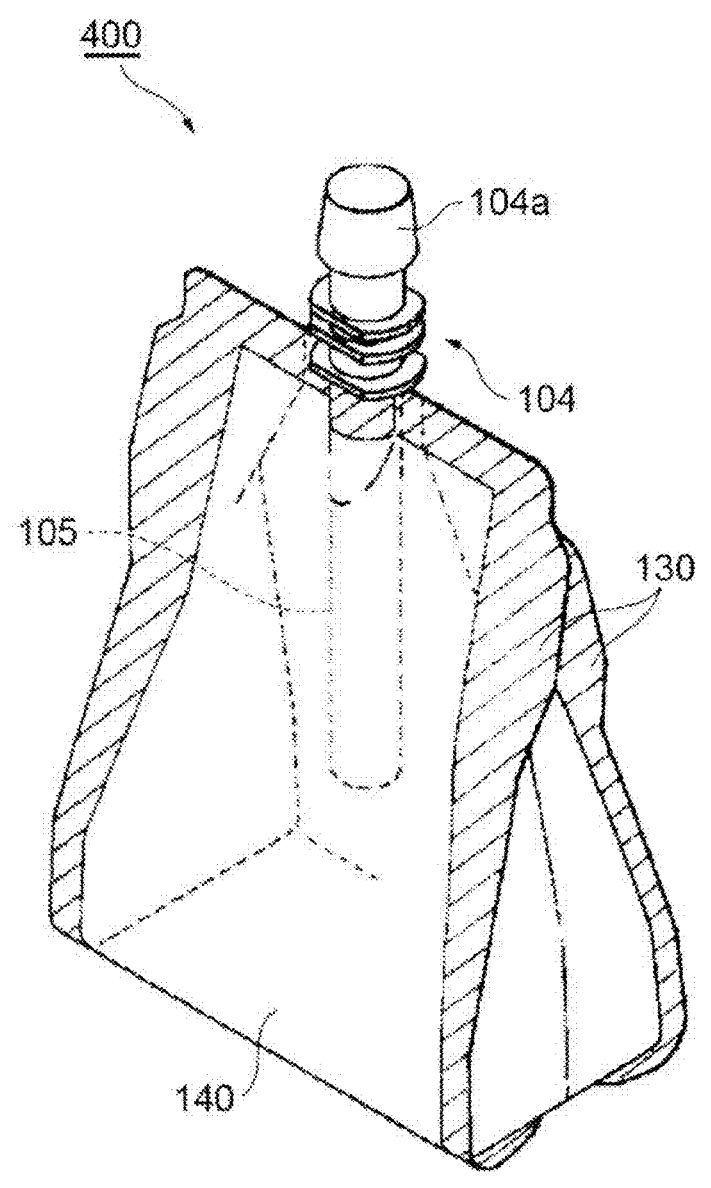
FIG. 4 is a perspective view of a packaging bag according to an embodiment.

FIG. 4 is a perspective view of a packaging bag according to an embodiment. The packaging bag shown in FIG. 4 is a spout-equipped packaging bag (gazette bag with spout). In a spout-equipped packaging bag 400 shown in FIG. 4, the sealant layers of the packaging member are attached together at a sealing portion 130, and a spout 104 is inserted and fixed in the sealing portion 130. The spout 104 is provided with a straw 105 that reaches the bottom of the container. The spout-equipped packaging bag 400 can be sealed by closing a spout cap 104*a*. The packaging bag 140 constituting the spout-equipped packaging bag 400 may be a gusset bag that can stand on its own by expanding the lower part of the bag when filled with contents to form a bulging shape.

Since the packaging member of the present embodiment is soft and maintains high gas barrier properties even after bending, so it can also be suitably used as a squeeze pouch. The squeeze pouch may be provided with a resealable spout, or may be of a structure in which the pouch is cut out to provide a spout for single use.

Another form of spout-equipped packaging bag is a bag-in-box, in which a bag (inner bag) containing a liquid such as a soft drink or alcoholic beverage is placed in a carton (outer box). The packaging member of the present embodiment can be used for the bag-in-box type bag, particularly for a bag with a spout (tube) for pouring.

In the case of any of the above spout-equipped packaging bags, it is preferable to use the same resin as the substrate layer and the sealant layer of the packaging member for the spout portion or the entire spout including the cap, in order to improve recyclability.

<Tubular Container>

The packaging member of the present embodiment can be used for the body of the tubular container. That is, the tubular container of the present embodiment includes the above packaging member.

Figure 5:
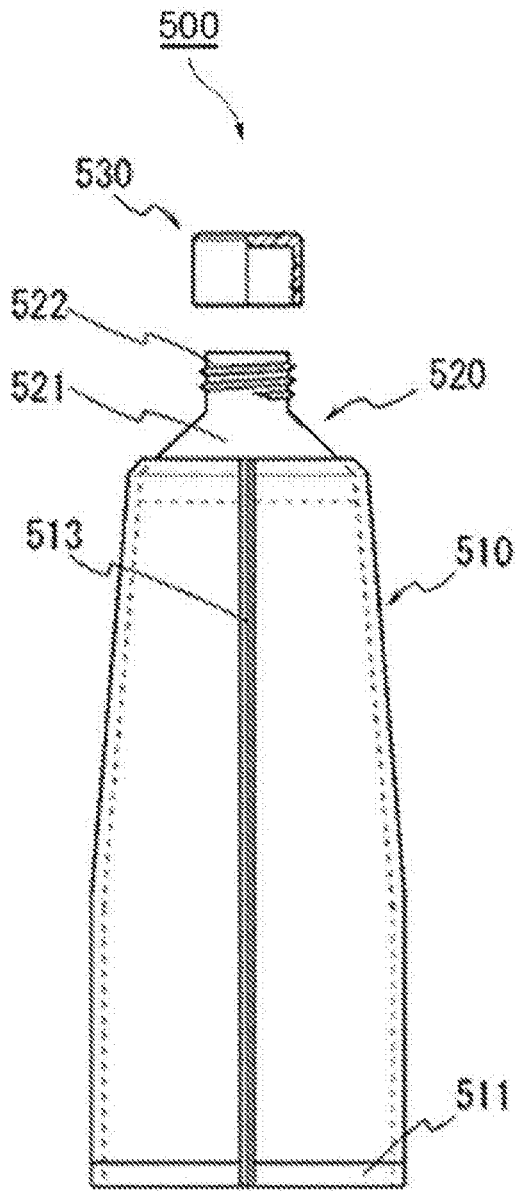
FIG. 5 is a front view of a tubular container according to an embodiment.

FIG. 5 is a front view of a tubular container according to an embodiment. A tubular container 500 shown in FIG. 5 has a body 510 made of packaging member, an outlet portion 520 attached to one end of the body 510, and a cap 530 attached to the outlet portion 520. The body 510 is a cylindrical member formed to contain the contents by adhering the sealant layers of the packaging material together at the sealing portion 513 and closing a bottom portion 511 located at the other end opposite to the end where the outlet portion 520 is attached. The outlet portion 520 includes a spout portion 522 from which the contents are discharged and a shoulder 521 which is held by the body 510 to guide the contents to the spout portion 522. The cap 530 is a member that enables closing and opening of the spout portion 522.

The layer composition of the body of a laminated tube, which is a type of tubular container, can be, for example, from the innermost layer, first sealant layer, an adhesive layer, a gas barrier laminate, an adhesive layer, and a second sealant layer. The orientation of the substrate layer in the gas barrier laminate may be toward the first sealant layer or toward the second sealant layer. The printed layer may be arranged on one surface of the second sealant layer and attached to the gas barrier laminate via the adhesive layer, or may be arranged on one side of the first sealant layer and attached to the gas barrier laminate via the adhesive layer.

Alternatively, a resin layer similar to the substrate layer, which is not intended for heat sealing, may be used for the body of the tubular container instead of the second sealant layer, which is the outermost layer. In this case, the body can also be formed into a cylindrical shape by attaching together the innermost sealant layers facing each other at the end (sealing portion) of the packaging member. Since it is not necessary to use the outermost layer as a sealant layer, high-density polyethylene or polypropylene resin can be selected as the material for the outermost layer, improving the durability and aesthetic qualities of the tubular container. Since the sealant layer can have a thickness of about 200 µm, the use of a resin layer (about 20 to 30 µm thick) as the outermost layer instead of a sealant layer can greatly reduce the amount of plastic used for the entire container.

By using the outermost layer as the substrate layer without providing a second sealant layer, the amount of plastic used in the entire tubular container can be further reduced. In this case, the printing layer may be formed on the substrate layer, which is the outermost layer, and protected with an overprint varnish. In a tubular container without a second sealant layer, the thickness of the packaging member at the body is thinner than that in a tubular container with a second sealant layer. Therefore, although the stress applied to the packaging member during bending is considered to be relatively high, the packaging member of the present embodiment may be used preferably because it has gas barrier properties and maintains high gas barrier properties even after bending.

The shape of the tubular container can be such that the shoulder is perpendicular to the body without being tapered, so that the contents can be squeezed out of the tubular container to the end. The material for the outlet portion and cap of the tubular container is not particularly limited, but the same resin as the substrate layer and the sealant layer can be used to further improve recycling compatibility. Tubular containers sometimes have an easy-release film attached to the outside of the spout portion that closes the opening in order to seal the container until it is first opened. The packaging member of the present embodiment can also be used as a lid member for sealing such an opening in combination with an easy-release sealant.

EXAMPLES

The present disclosure is more particularly described by way of Experimental Examples, to which the present disclosure should not be construed as being limited.

(Preparation of Anchor Coat Layer-Forming Composition)

The acrylic polyol was mixed with tolylene diisocyanate so that the number of NCO groups in the tolylene diisocyanate became equivalent to the number of OH groups in the acrylic polyol, followed by dilution with ethyl acetate so that the total solid content was 5% by mass (the total amount of acrylic polyols and tolylene diisocyanates). To the diluted mixed solution, β-(3,4-epoxycyclohexyl) trimethoxysilane was further added in an amount of 5 parts by mass relative to a total of 100 parts by mass of mixed acrylic polyol and tolylene diisocyanate, which were then mixed to prepare an anchor coat layer-forming composition (anchor coat material).

(Preparation of Overcoat Layer-Forming Composition L1)

A polyurethane resin (Takelac WPB-341 manufactured by Mitsui Chemicals, Inc.) and a 5% PVA aqueous solution (PVA 124 manufactured by Kuraray Co., Ltd.) were mixed so that the solid content ratio was 50:50, and then diluted with water and isopropanol to make the solid concentration of the solution 5% by mass. At this time, isopropanol was 10% by mass of the whole. Thus, an overcoat layer-forming composition (overcoat material) L1 was prepared.

(Preparation of Overcoat Layer-Forming Composition L2)

A polyurethane resin, a 5% PVA aqueous solution, and a silane coupling agent (3-glycidoxypropyltriethoxysilane) were mixed so that the solid content ratio was 50:45:5, and then diluted with water and isopropanol so that the solid content of the solution was 5% by mass. At this time, isopropanol was 10% by mass of the whole. Thus, an overcoat layer-forming composition L2 was prepared.

(Preparation of Overcoat Layer-Forming Composition L3)

An overcoat layer-forming composition L3 was prepared by mixing the following solutions A, B, and C at a mass ratio of 65/25/10.

Solution A: Hydrolyzed solution with a solid content of 5 mass % (in terms of $SiO_2$ equivalent) obtained by adding 72.1 g of 0.1 N hydrochloric acid to 17.9 g of tetraethoxysilane (TEOS: KBE-04 manufactured by Shin-Etsu Chemical Co., Ltd.) and 10 g of methanol and stirring for 30 minutes for hydrolysis.

Solution B: Water/methanol solution containing 5 mass % of polyvinyl alcohol (mass ratio of water:methanol is 95:5).

Solution C: Hydrolyzed solution prepared by diluting 1,3,5-tris (3-trialkoxysilylpropyl) isocyanurate with a mixture of water and isopropyl alcohol (mass ratio of water: isopropyl alcohol is 1:1) to produce a solid content of 5 mass %.

(Preparation of Overcoat Layer-Forming Composition L4)

An overcoat layer-forming composition L4 was prepared in the same manner as the overcoat layer-forming composition L1 except that polyurethane resin and a 5% PVA aqueous solution were mixed so that the solid content ratio was 65:35.

(Preparation of Substrate Layer)

OPP film: U-1 manufactured by Mitsui Chemicals Tohcello, Inc., thickness 20 μm

PE film: SMUQ manufactured by Tokyo Printing Ink Mfg. Co., Ltd., thickness 25 μm

Example 1

A transparent metal oxide layer (a metal oxide-containing layer) composed of silicon oxide (SiOx) with a thickness of 50 nm was formed on the OPP film using a vacuum deposition system with an electron beam heating method.

The overcoat layer-forming composition L1 was coated on the metal oxide layer by the gravure roll coating method, and the coated film was heated and dried at 60° C. for 1 minute to form a 400 nm thick overcoat layer. Thus, a barrier film was obtained.

Example 3

The above anchor coat layer-forming composition was coated on the OPP film by the gravure roll coating method, and the coated film was dried and cured at 60° C. to form an anchor coat layer having a coating amount of 0.1 g/m² per unit area and a thickness of 40 nm.

Then, a metal oxide layer was formed on the anchor coat layer in the same manner as in Example 1.

The overcoat layer was formed on the metal oxide layer in the same manner as in Example 1 except that the overcoat layer-forming composition L2 was used. Thus, a barrier film was obtained.

Other Examples and Comparative Examples

A barrier film was obtained in the same manner as in Examples 1 or 3, except that the substrate layer, anchor coat layer, metal oxide layer, and overcoat material were changed as shown in Table 1. In Examples 4 and 5, a transparent metal oxide layer made of aluminum oxide (AlOx) with a thickness of 50 nm was formed on the anchor coat layer by using a vacuum deposition system with an electron beam heating method.

(Measurement of Softening Temperature)

The softening temperature of the overcoat layer was measured by local thermal analysis (LTA). The following measuring devices were used.

Measuring device: Atomic force microscope (AFM) manufactured by Oxford Instruments

MFP-3D-SA

LTA option: Ztherm system (trade name)

Cantilever: AN2-200 manufactured by ANSYS Instruments

First, the cantilever was moved close to the surface of the overcoat layer, and shape measurement was performed in a field of view of 5 μm x 5 μm, and 10 measurement points were determined from the obtained shape image. Next, LTA measurement was performed to measure the shape for confirming measurement marks. When the surface of the overcoat layer was heated by applying a voltage to the cantilever while keeping the contact pressure constant, the surface of the overcoat layer thermally expanded and the cantilever rose. Then, when the temperature reached a certain level, the surface of the overcoat layer softened and the cantilever descended. The temperature at which the maximum displacement of the cantilever occurred was measured as the softening temperature of the surface of the overcoat layer. The contact pressure was 1 V and the heating rate was 0.5 V/sec, and the cantilever was heated until it penetrated 50 nm from the maximum displacement.

Cantilever temperatures were calibrated using four standard specimens having known softening temperatures in advance. Four standard specimens were used: polycaprolactone (melting point: 56° C.), low-density polyethylene (LDPE, melting point: 111° C.), polypropylene (PP, melting point: 164° C.), and polyethylene terephthalate (PET, melting point: 253° C.). Measurements were made twice at different measurement positions, and the average value was used as the surface softening temperature to create a standard curve, and using the standard curve, the calibration curve was created. Using this calibration curve, the voltage applied to the cantilever was converted to temperature to determine the softening temperature of the overcoat layer. The results are shown in Table 1.

TABLE 1

| | Sub-strate layer | Anchor layer coat | Metal layer oxide | Over-coat material | Overcoat layer | | | |
| | | | | | Composition | Mass ratio | Softening temperature (° C.) | Thick-ness (nm) |
|---|---|---|---|---|---|---|---|---|
| Example 1 | OPP | No | SiOx | L1 | Urethane/PVA | 50:50 | 140 | 400 |
| Example 2 | OPP | No | SiOx | L2 | Urethane/PVA/Silane coupling agent | 50:45:5 | 138 | 400 |

TABLE 1-continued

| | | | | Overcoat layer | | | | |
|---|---|---|---|---|---|---|---|---|
| | Sub-strate layer | Anchor layer coat | Metal layer oxide | Over-coat material | Composition | Mass ratio | Softening temperature (° C.) | Thick-ness (nm) |
| Example 3 | OPP | Yes | SiOx | L2 | Urethane/PVA/ Silane coupling agent | 50:45:5 | 138 | 400 |
| Example 4 | OPP | Yes | AlOx | L2 | Urethane/PVA/ Silane coupling agent | 50:45:5 | 138 | 400 |
| Example 5 | OPP | Yes | AlOx | L2 | Urethane/PVA/ Silane coupling agent | 50:45:5 | 138 | 850 |
| Example 6 | PE | Yes | SiOx | L2 | Urethane/PVA/ Silane coupling agent | 50:45:5 | 138 | 400 |
| Comparative Example 1 | OPP | Yes | SiOx | L3 | TEOS/PVA/ Silane coupling agent | 65:25:10 | 300< | 400 |
| Comparative Example 2 | PE | Yes | SiOx | L3 | TEOS/PVA/ Silane coupling agent | 65:25:10 | 300< | 150 |
| Comparative Example 3 | OPP | Yes | SiOx | L4 | Urethane/PVA | 65:35 | 175 | 400 |

(Evaluation of Oxygen Barrier Properties)

On the overcoat layer of the barrier film obtained in each example, a CPP film (Torayfan ZK 207, thickness of 60 μm) manufactured by TORAY ADVANCED FILM CO., LTD. or an LLDPE film (T.U.X MC-S, thickness of 60 μm) manufactured by Mitsui Chemicals Tohcello, Inc., was attached using an adhesive (A-525/A-52 manufactured by Mitsui Chemicals, Inc.) to produce a laminated film. CPP films were used when the substrate was OPP and LLDPE films were used when the substrate was PE.

The obtained laminated film was used to make a three-sided pouch, which was filled with city water and boiled at 95° C. for 30 minutes. Thus, a boiled specimen was obtained.

The thus laminate film was attached to a fixed head of a Gelbo Flex test, manufactured by Tester Sangyo Co., Ltd., in the form of a cylinder of 87.5 mm in diameter x 210 mm. Both ends of the attached laminate film were held, with an initial gripping distance of 175 mm, and a 440 degree twist was applied with a stroke of 87.5 mm. Ten sets of repetitive reciprocating movements of this motion were performed at a speed of 40 times/min. Thus, a bend-tested sample was obtained.

Oxygen permeability was measured for the obtained boiled specimen and the bending-tested specimen. As a measuring device, an oxygen permeability measuring device (OX-TRAN2/20 manufactured by MOCON) was used, and the measurement was performed under conditions of a temperature of 30° C. and a relative humidity of 70% (JIS K-7126-2). The results are shown in Table 2.

TABLE 2

| | Oxygen permeability (cc/m$^2$ · day · atm) | |
|---|---|---|
| | After boiling | After bending test |
| Example 1 | 0.50 | 8.1 |
| Example 2 | 0.40 | 7.4 |
| Example 3 | 0.30 | 5.2 |
| Example 4 | 0.80 | 6.6 |

TABLE 2-continued

| | Oxygen permeability (cc/m$^2$ · day · atm) | |
|---|---|---|
| | After boiling | After bending test |
| Example 5 | 0.10 | 9.5 |
| Example 6 | 0.80 | 7.1 |
| Comparative Example 1 | 0.10 | 24.5 |
| Comparative Example 2 | 2.50 | 18.5 |
| Comparative Example 3 | 0.60 | 11.3 |

REFERENCE SIGNS LIST

1 . . . Substrate layer; 2 . . . Metal oxide-containing layer; 3 . . . Overcoat layer; 4 . . . Sealant layer; 10 . . . Gas barrier laminate; 100, 200 . . . Packaging member; 104 . . . Spout; 104a . . . Spout cap; 105 . . . Straw; 130 . . . Sealing portion; 140 . . . Packaging bag; 400 Spout-equipped packaging bag; 510 . . . Body; 511 . . . Bottom; 513 . . . Sealing portion; 520 . . . Outlet portion; 521 . . . Shoulder; 522 . . . Spout portion; 530 . . . Cap; 500 . . . Tubular container.

What is claimed is:

1. A gas barrier laminate, comprising:
   a substrate layer which contains a polyolefin resin;
   a metal oxide-containing layer which contains a metal oxide; and
   an overcoat layer which contains a polyvinyl alcohol resin and a polyurethane resin, a mass ratio between the polyurethane resin and the polyvinyl alcohol resin being 0.9 to 1.2, the overcoat layer having a surface which has a softening temperature of 130 to 170° C., as measured by local thermal analysis.

2. The gas barrier laminate of claim 1, wherein the metal oxide-containing layer is made of a vacuum deposition layer and has a thickness of 5 to 100 nm.

3. The gas barrier laminate of claim 1, wherein the overcoat layer contains Si.

4. The gas barrier laminate of claim 1, further comprising an anchor coat layer between the substrate layer and the metal oxide-containing layer.

5. The gas barrier laminate of claim 1, wherein the overcoat layer has a thickness of 100 to 800 nm.

6. The gas barrier laminate of claim 1, wherein the softening temperature of the surface of the overcoat layer is from 130 to 140° C.

7. The gas barrier laminate of claim 1, wherein the overcoat layer is prepared by coating a coating liquid, wherein solids in the coating liquid consists of the polyurethane resin, the polyvinyl alcohol resin and optionally, a silane coupling agent.

8. The gas barrier laminate of claim 1, wherein wherein the mass ratio between the polyurethane resin and the polyvinyl alcohol resin is 50:50.

9. The gas barrier laminate of claim 1, wherein the overcoat layer further comprises a silane coupling agent, and wherein a mass ratio between the polyurethane resin, the polyvinyl alcohol resin and the silane coupling agent is 50:45:5.

10. The gas barrier laminate of claim 1, wherein the overcoat layer is prepared by coating a coating liquid, wherein solids in the coating liquid consists of the polyurethane resin and the polyvinyl alcohol resin.

11. The gas barrier laminate of claim 10, wherein the mass ratio between the polyurethane resin and the polyvinyl alcohol resin is 50:50.

12. The gas barrier laminate of claim 1, wherein the overcoat layer is prepared by coating a coating liquid, wherein solids in the coating liquid consists of the polyurethane resin, the polyvinyl alcohol resin and a silane coupling agent.

13. The gas barrier laminate of claim 12, wherein the silane coupling agent is 3-glycosidoxypropyltriethoxysilane.

14. The gas barrier laminate of claim 12, wherein a mass ratio between the polyurethane resin, the polyvinyl alcohol resin and the silane coupling agent is 50:45:5.

15. A packaging member, comprising:

the gas barrier laminate of claim 1; and a sealant layer.

16. A packaging bag comprising the packaging member of claim 15.

17. A tubular container comprising the packaging member of claim 15.

\* \* \* \* \*